United States Patent
Fuentes-Fernandez et al.

(10) Patent No.: US 8,633,634 B2
(45) Date of Patent: Jan. 21, 2014

(54) MEMS-BASED CANTILEVER ENERGY HARVESTER

(71) Applicants: The Board of Regents of the University of Texas System, Austin, TX (US); Texas Micropower, Inc., Dallas, TX (US)

(72) Inventors: Erika Fuentes-Fernandez, Richardson, TX (US); Pradeep Shah, Dallas, TX (US); Wardia Mechtaly-Debray, Hsinchu County (TW); Bruce E. Gnade, Lewisville, TX (US)

(73) Assignees: The Board of Regents of the University of Texas System, Austin, TX (US); Texas Micropower, Inc., Dallas, TX (US)

( * ) Notice: Subject to any disclaimer, the term of this patent is extended or adjusted under 35 U.S.C. 154(b) by 0 days.

(21) Appl. No.: 13/680,043

(22) Filed: Nov. 17, 2012

(65) Prior Publication Data

US 2013/0140950 A1    Jun. 6, 2013

Related U.S. Application Data

(60) Provisional application No. 61/561,715, filed on Nov. 18, 2011.

(51) Int. Cl.
  *H01L 41/113*    (2006.01)
  *H01L 41/083*    (2006.01)

(52) U.S. Cl.
  USPC .......................................... 310/339; 310/346

(58) Field of Classification Search
  USPC ................................................. 310/339, 346
  See application file for complete search history.

(56) References Cited

U.S. PATENT DOCUMENTS

| | | | |
|---|---|---|---|
| 8,079,670 B2* | 12/2011 | Silverbrook | 347/54 |
| 2008/0309723 A1* | 12/2008 | Silverbrook | 347/47 |
| 2011/0096122 A1* | 4/2011 | Silverbrook | 347/44 |

* cited by examiner

*Primary Examiner* — Thomas Dougherty
(74) *Attorney, Agent, or Firm* — Winstead PC

(57) ABSTRACT

The claimed invention is directed to integrated energy-harvesting piezoelectric cantilevers. The cantilevers are fabricated using sol-gel processing using a sacrificial poly-Si seeding layer. Improvements in film microstructure and electrical properties are realized by introducing a poly-Si seeding layer and by optimizing the poling process.

14 Claims, 5 Drawing Sheets

| | |
|---|---|
| Cr/Au | TOP ELECTRODES |
| PZT | PIEZOELECTRIC MATERIAL |
| PT | SEED LAYER |
| $TiO_2$ | BUFFER LAYER |
| PECVD OXIDE | INTERFACE IMPROVEMENT |
| $Si_3N_4$ | MECHANICAL STRENGTH |
| $SiO_2$ | INTERFACE IMPROVEMENT |
| Poly-Si | ETCHING |
| Si | SUBSTRATE |

MEMS-BASED CANTILEVER ENERGY HARVESTER

CROSS-REFERENCES TO RELATED APPLICATIONS

This Application claims the benefit under 35 U.S.C. §119(e) of U.S. Provisional Patent Application Ser. No. 61/561,715, filed Nov. 18, 2011, which is incorporated herein by reference in its entirety as if fully set forth herein.

STATEMENT REGARDING FEDERALLY-SPONSORED RESEARCH OR DEVELOPMENT

This invention was made with government support under NSF Phase I STTR Grant No. 810391 and Grant No. 0937831 and Award No. 1045980 from the National Science Foundation, supplemented by Texas Emerging Technology Fund seed grants. The government has certain rights in the invention.

BACKGROUND OF THE INVENTION

Energy scavenging and harvesting is becoming a critical element in designing embedded, self-powered and autonomous electronic systems and gadgets in a broad range of commercial, industrial, consumer and healthcare applications. Applications requiring micro-energy sources are especially challenging.

Recently there has been an increase in research related to energy harvesting from non-traditional alternate energy sources such as vibrations. Typically the size of a vibrational energy harvesting device varies from hundreds of microns to several centimeters. There are three primary transduction modes used in vibrational-based energy harvesting devices: 1) Electromagnetic transducers, 2) Electrostatic transducers, and 3) Piezoelectric transducers. This patent disclosure focuses on using MEMs-based piezoelectric cantilever transducers for vibrational energy harvesting.

Piezoelectricity is a property of certain materials, that when subjected to mechanical strain, undergoes an electrical polarization that is proportional to the applied strain. This property can be used to convert mechanical energy to electrical energy. This method is widely used to produce energy, especially for low-power applications. Some of the applications of the piezoelectric effect for energy harvesting are: remote area sensors, structural health monitoring, airplane sensor networks, implanted medical devices, space applications, consumer personal applications such as wearable computers and autonomous tracking devices in industrial and transportation applications.

Materials such as lead zirconate titanate $Pb(Zr,Ti)O_3$ ceramics can undergo a shape change of ~0.1%, resulting in the generation of a voltage that can be used as an energy source. Vibrations can cause some strain in these materials and, therefore, produce an electric signal. Some of the advantages of using vibrations as an energy source are: the energy source has, in principle, an infinite lifetime; and no physical connections to the energy source are needed (stand alone system). Furthermore, the device can be enclosed and protected from harsh environments. Ambient acoustical energy (either acoustical noise or artificially generated acoustical energy) can be used as an on-demand energy source. Another advantage of a vibrational energy source are that high output voltage can be achieved, and small sizes and relatively simple structures with high efficiency can also be achieved.

Some disadvantages of vibrational energy harvesters include the fact that they are relatively difficult to integrate in a micro-system due to their discrete and large form factors to date, and the energy output is frequency dependent limited by the form factor. Also the availability of vibrational energy can be intermittent.

For energy harvesting from vibration, it is known that the cantilever configuration is the optimal design to maximize mechanical to electrical conversion. Further, the cantilever configuration has been reported in two main variants based on the direction of stress and the electric field—$d_{33}$ and $d_{31}$. The $d_{33}$ cantilever is typically the preferred geometry over the $d_{31}$ because the $d_{33}$ piezoelectric constant is approximately two-times (2×) larger than $d_{31}$, which, when combined with larger spacing between the interdigitated electrode fingers relative to the piezoelectric film thickness, enhances the piezoelectric power generation.

Because the advantages of using vibrational energy outweigh the disadvantages, it would be desirable to develop an energy harvesting system using cantilevers that can be manufactured in an economical way and can be used in various applications.

SUMMARY OF THE INVENTION

An embodiment of the invention is directed to a piezoelectric energy harvester comprising stacked layers wherein the stacked layers comprise a silicon substrate layered with a polysilicon layer, a silicon oxide layer, a silicon nitride layer, a PECVD silicon oxide layer, a titanium oxide layer, a PT layer and a PZT-PZN layer. Another embodiment of the invention is directed to a method for fabricating a piezoelectric energy harvester comprising: placing a polysilicon layer on top of a silicon substrate; sputtering a barrier layer on top of the substrate; treating the substrate by thermal treatment; depositing a template layer using the sol-gel process; thermally treating the deposited template layer; depositing a piezoelectric layer; thermally treating the piezoelectric layer; and subjecting the deposited layers to an etching process.

A further embodiment of the invention is directed to an energy harvesting circuit comprising: a vibrational energy harvesting device; a power rectification circuit for converting oscillatory current electric power to direct current electric power; and an energy storage device.

DETAILED DESCRIPTION OF EXEMPLARY EMBODIMENTS

An embodiment of the invention provides a novel design and process to release a thin-film piezoelectric cantilever for energy harvesting based on a front-side wet etch process enabled by the addition of a sacrificial layer which etches isotropically under the cantilever stack. The process is inexpensive and compatible with batch processing; in contrast to conventional dry etch processing which typically uses very expensive chemicals such as $XeF_2$. The process is based on mature planar semiconductor film depositions, patterning and etching concepts suitable for automated linearized flow for high volume manufacturing cost reduction. The claimed process also improves the morphology, phase purity and the electrical properties of the piezoelectric material.

Another embodiment of the invention is directed to a novel technique for fabricating cantilevers for vibrational energy harvesting applications. The cantilevers are fabricated using a combination of chemical and physical methods. A schematic of the cross section of a fabricated cantilever in accordance with an embodiment of the invention is shown in FIG. 1.

Figure 1:
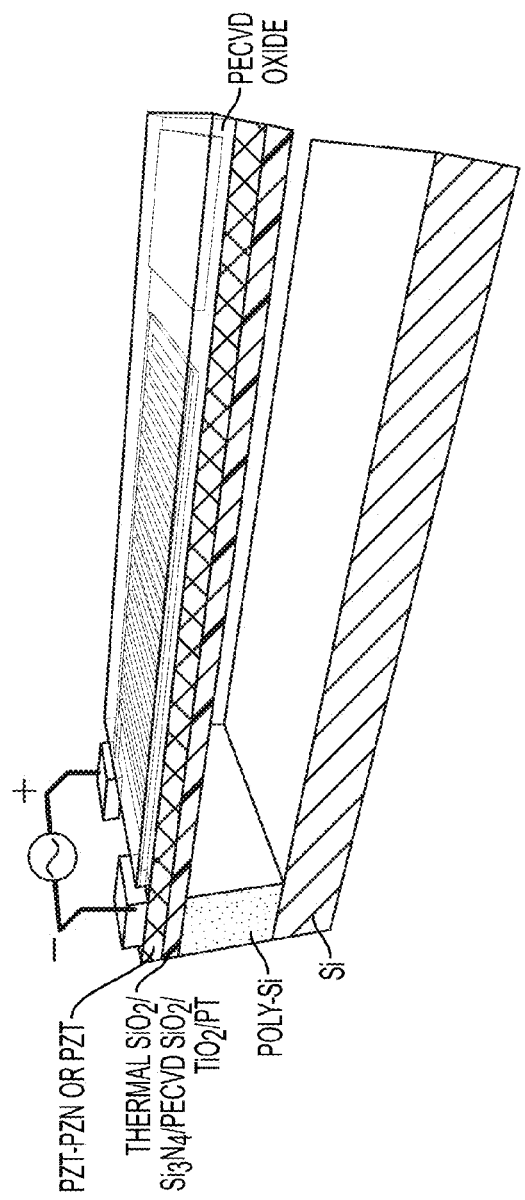
FIG. 1 shows a schematic cross section of a fabricated cantilever in accordance with an embodiment of the invention.

In an embodiment of the invention as set forth in FIG. 1, a polysilicon layer is placed on top of a silicon substrate in a first step in the fabrication of a piezoelectric cantilever stack. The polysilicon layer provides a sacrificial layer that can be selectively removed isotropically using a wet etch process to produce freestanding cantilevers. The sacrificial layer has several required properties, including; 1) the sacrificial layer has to be mechanically and chemically stable to the subsequent piezoelectric thin-film fabrication processes, which include long thermal treatments at >600° C. in air, 2) the sacrificial layer has to provide a surface which would be suitable for the growth of large grain PZT-based piezoelectric thin-film, 3) the sacrificial layer has to be capable of being isotropically removed using a liquid chemistry that is selective for the poly-Si sacrificial layer and compatible with the thin-film piezoelectric and the substrate stack, and 4) the sacrificial layer has to be compatible with a silicon CMOS process flow, because the produced cantilevers may be integrated with silicon CMOS-based control electronics. Following the placement of the polysilicon layer by a LPCVD process (low pressure chemical vapor deposition), in certain embodiments of the invention, a layer of thermal silicon oxide ($SiO_2$) is placed on top of the polysilicon layer. The simplest way to produce silicon oxide layers on silicon is the oxidation of silicon by oxygen. Following the deposition of the silicon oxide layer, in certain embodiments of the invention, a layer of silicon nitride is deposited by a LPCVD process (low pressure chemical vapor deposition). In other embodiments of the invention, the silicon dioxide layer is deposited by PECVD systems (plasma enhanced chemical vapor deposition).

In certain embodiments of the claimed invention, as shown in FIG. 1, the polysilicon layer is layered with thermal and PECVD silicon oxide, silicon nitride ($Si_3N_4$), titanium oxide ($TiO_2$), PT ($PbTiO_3$) and PZT ($Pb(Zr,Ti)O_3$) or PZT-PZN ($Pb(Zr,Ti)O_3$—$Pb(Zn,Nb)O_3$) layers.

Figure 2:
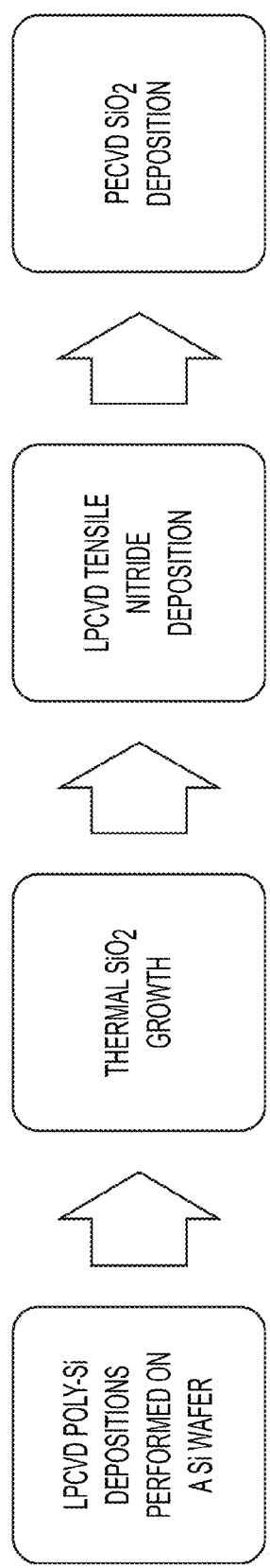
FIG. 2 shows an example of the process flow in an embodiment of the invention.

An embodiment of the invention provides a process flow that integrates the polysilicon sacrificial layer. The fabrication of the cantilever's substrate involves the development of several materials (thin films) and processes. An example of the process flow in an embodiment of the invention is set forth in FIG. 2. First, LPCVD Poly-silicon is deposited on a silicon wafer substrate. Next, silicon oxide is deposited on the polysilicon layer followed by the deposition of LPCVD $Si_3N_4$ on the $SiO_2$ layer. Finally, in accordance with an embodiment of the invention, PECVD $SiO_2$ is deposited on the nitride layer. In an embodiment of the invention, the films and thicknesses used for the substrate preparation are: 3 µm of Poly-Si, 100 nm of thermal $SiO_2$, 350 nm of tensile stress $Si_3N_4$, and 500 nm of PECVD $SiO_2$. The thickness of the $Si_3N_4$ and PECVD $SiO_2$ can be varied to control the stress in order to produce planar, free standing piezoelectric cantilevers.

Figure 3:
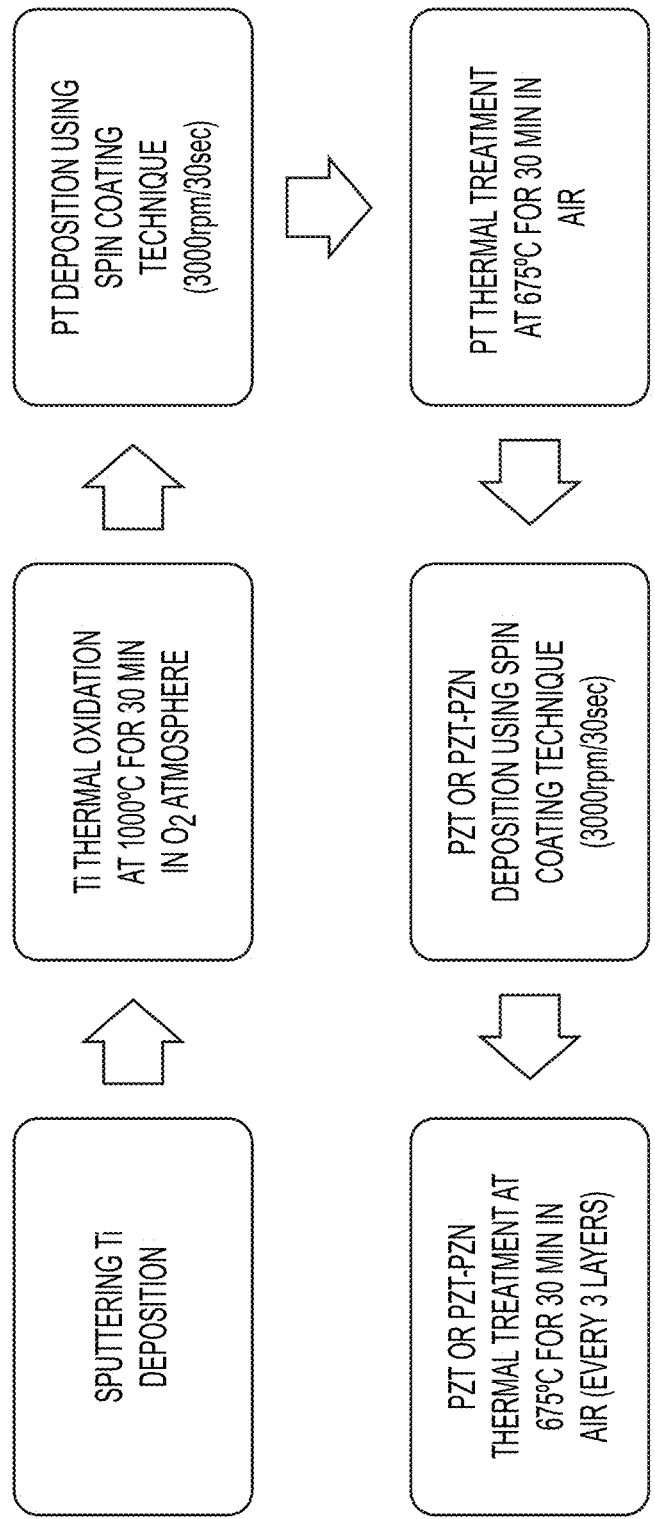
FIG. 3 shows a procedure for the template and piezoelectric layer deposition in accordance with an embodiment of the invention.

In another embodiment of the invention as set forth in FIG. 3, following the preparation of the substrate, a layer of Ti is deposited using a sputtering process followed by a thermal treatment. In the embodiments of the invention, the thermal treatment is carried out at 1000° C. in air for 30 min to achieve about 50 nm of $TiO_2$. Following the thermal treatment, a template layer of $PbTiO_3$ (PT) is deposited using a sol-gel process based on lead (IV) acetate (reagent grade, 95%), titanium isopropoxide (99.99% purity based on trace metal analysis), acetic acid (95%), and methanol (spectrophotometric grade, 99%). The PT film is exposed to a thermal treatment, which is typically carried out at 675° C. for 30 min in air. Subsequently, the $Pb(Zr,Ti)O_3$ (PZT) based films are deposited using a sol-gel process followed by thermal treatment.

FIG. 3 describes the procedure for the template and piezoelectric layer deposition. An embodiment of the invention provides a $Pb(Zr,Ti)O_3$—$Pb(Zn,Nb)O_3$ (PZT-PZN) thin film, which is synthesized in a very similar way as PZT. In certain embodiments of the invention, the starting precursors including zirconium (IV) butoxide, titanium(IV) isopropoxide, and niobium (V) ethoxide are reacted in acetic acid (95%) and methanol.

In an embodiment of the invention, the fabrication of the cantilevers is carried out using a 4-photo mask process. A first mask is used to pattern the interdigited electrodes using lift-off. A second mask is used for the encapsulation of the devices with 100 nm of PECVD $SiO_2$ using lift-off. A third mask is used to deposit extra Au pad at the end of the cantilever (for the subsequent proof mass) and at the contact electrodes to facilitate bonding in the final step of packaging. Lastly, a fourth mask (cantilever etch mask) is used to define the pattern for wet etch of the PZT-PZN or PZT//PT/$TiO_2$/PECVD $SiO_2$/$Si_3N_4$/$SiO_2$/Poly-Si stack.

As previously stated, the sacrificial layer is critical in the cantilever release etch process. After the pattern of the third mask is defined on the sample, the cantilever etch mask (fourth mask) is aligned. In an embodiment of the invention, photoresist S1813 (PR) is spun-on at 1000 rpm for 60 sec to obtain a 31.1 µm thick film. The PR is then baked for 5 min at 115° C. and then exposed to a dose of 368 mJ/cm$^2$. The PR is developed using MF319 for 2.5 min and rinsed with water. A descumming process or "descum" is performed with reactive-ion-etching (RIE) at 100 mTorr using $O_2$ and 50 Watts of power for 3.5 min. A final photo resist bake is carried out at 115° C. for 10 min.

Figure 4A:
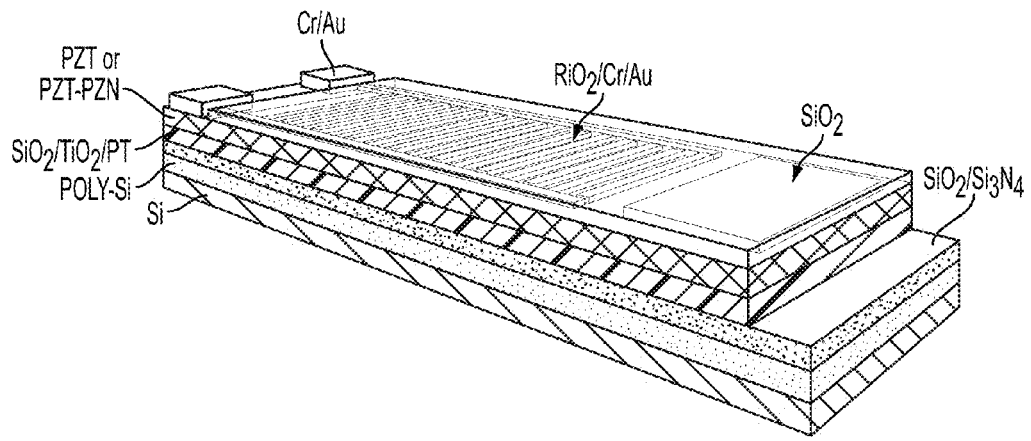
FIGS. 4A to 4C show the etching process in accordance with an embodiment of the invention.
Figure 4B:
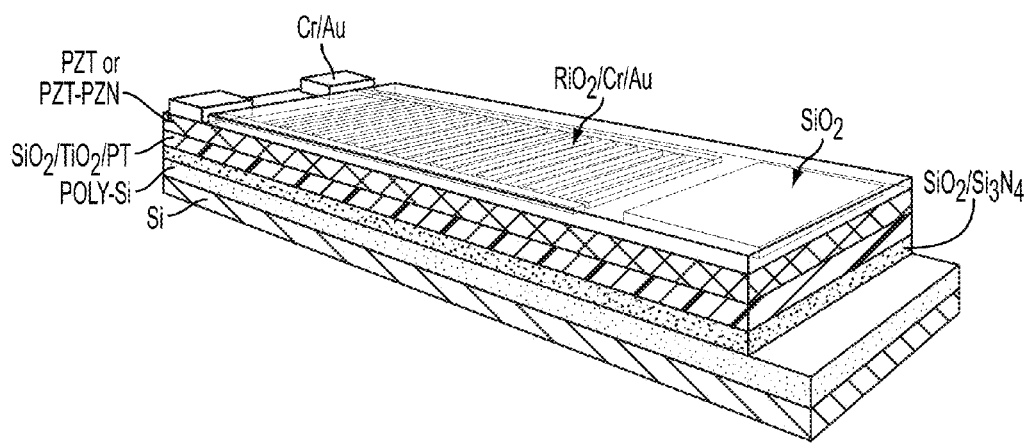
Figure 4C:
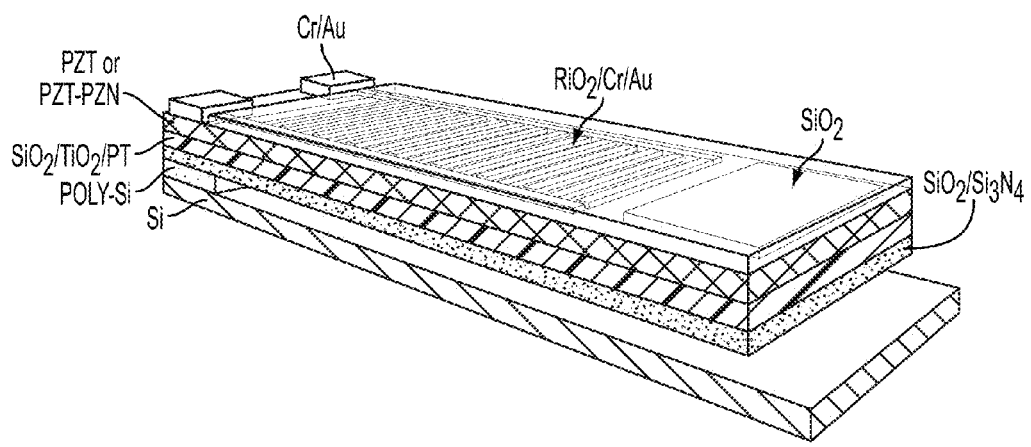
Figure 5:
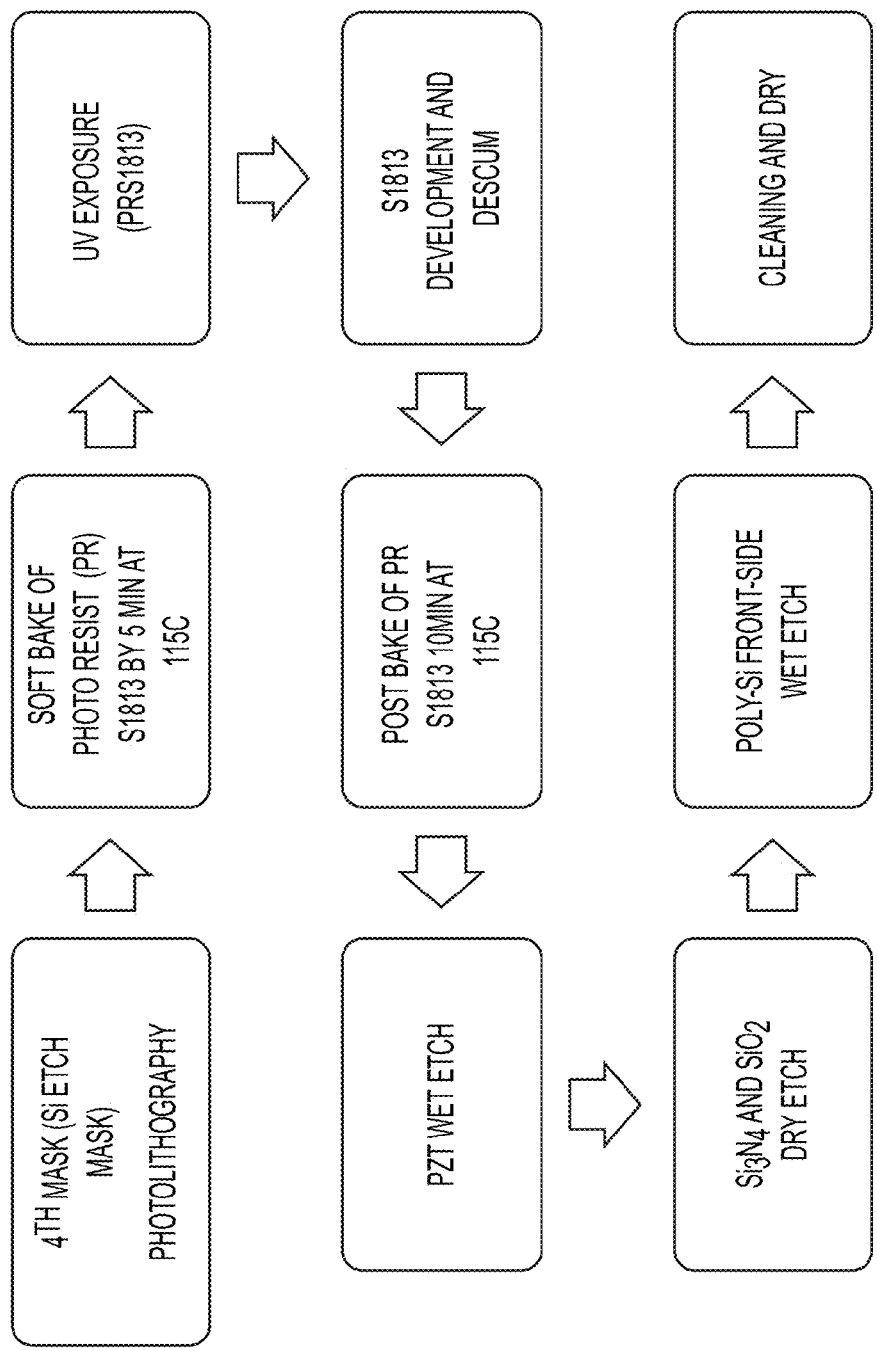
FIG. 5 shows the overall process flow in accordance with an embodiment of the invention.

Next, the PZT-base thin film is etched. In an embodiment, 20% HF is used for the etching process. The etching process is used as many times as necessary to etch the cantilever etch pattern in to the piezoelectric film as well as the $SiO_2$ layer under it. The $Si_3N_4$ is exposed and a dry etch process is used to remove it as well as the $SiO_2$ layer underneath to leave the Poly-Si layer exposed. This is shown in FIGS. 4a-4c, and the overall process flow is shown in FIG. 5.

Lastly, the release of the cantilever is carried out. In the embodiments of the invention, the cantilever is released using a Si wet etch process. The preferred etch process is hot KOH solution because it etches polysilicon isotropically with good selectivity to PZT, PZT-PZN and $SiO_2$.

An embodiment of the invention is directed to the fabrication of Si-based cantilever devices for energy harvesting applications using piezoelectric materials. The claimed invention uses a novel front-side wet etch technique to release a cantilever device through the insertion of a Poly-Si layer that not only reduces cost, but also improves the physical properties of the piezoelectric material as well as the electrical properties of the transducer. The proposed technique is cheaper, easier, more scalable and more environmentally friendly than prior art techniques.

An embodiment of the invention describes a method using a polysilicon sacrificial layer and a KOH wet etch to fabricate freestanding thin-film devices such as thin-film piezoelectric devices, on a silicon substrate. The freestanding films can be cantilevers or membranes. The process is not specific to the cantilever structure such as simple straight beam or complex structures, and the resulting combinations and arrays increase the output voltage, current and overall power. The process is compatible with a standard Si CMOS process flow, allowing the freestanding films to be homogenously integrated with silicon control electronics.

A process, called poling process, involving the application of a strong DC field to preferentially orient the domains in the polycrystalline perovskite ceramic along the direction of applied field is used in certain embodiments of the invention. The poling process conditions (field, time, and temperature) have a dramatic impact on the piezoelectric properties and performance of the piezoelectric element. An embodiment of the invention is directed to the enhancement of the performance of piezoelectric energy harvesters by optimizing the poling process.

Different designs have been used to generate efficient vibration-to-energy converters, starting from macro devices using bulk piezoelectric materials, as well as micro devices using thin films. It is desirable for the micro devices to be fabricated on silicon substrates to allow integration of the energy harvester in a micro multi-functional system.

WORKING EXAMPLES

The energy harvesters of the claimed invention are based on cantilever design and are fabricated as follows. A relaxor thin film piezoelectric is deposited using solution processing, where the precursors zirconium (IV) butoxide, titanium (IV) isopropoxide, and niobium (V) ethoxide are reacted in acetic acid (95%) and methanol. Lead (IV) acetate and zinc acetate dihydrate are subsequently added and the solution is heated to 85° C. to dissolve the acetates. The sol-gel solution is spin-coated, at 3000 rpm for 30 sec on a multi-layer substrate designed to enable facile release of the cantilevers via a wet-etch process. The spun films (0.810 µm thick) were crystallized at 675° C. for 30 min in air to obtain phase-pure relaxor piezoelectric films A schematic of the finished cantilever stack used for this study is shown in FIG. 1, where its constituent layers are labeled. Starting with a Si substrate, a 3 µm poly-Si layer was deposited using LPCVD, followed by thermal oxide growth (100 nm), tensile LPCVD $Si_3N_4$ deposition (350 nm); and PECVD $SiO_2$ deposition (500 nm). The PECVD $SiO_2$ was deposited to improve the interphase between the nitride and the subsequent $TiO_2$ layer, which is formed by sputter depositing titanium and oxidizing in a furnace at 1000° C. for 1 hr. in $O_2$. The $PbTiO_3$ layer is deposited before the PZT-PZN. The relaxor thin piezoelectric film was then deposited on $TiO_2$ from the stock solution prepared previously and kept in a glove box.

The patterning, wet etching, and cantilever release steps were then carried out. The first photolithography step involved patterning of 50 nm $RuO_2$/40 nm Cr/400 nm Au interdigited electrodes (IDE). The $RuO_2$ is sputter deposited and the Cr/Au is deposited using e-beam evaporation. The $RuO_2$ layer was found necessary to minimize the aging of the piezoelectric properties. The next step involved PECVD oxide encapsulation to improve the long-term stability of the devices. The third step included the deposition of 40 nm Cr/400 nm Au on the bond pads for wire bonding. The cantilevers were then released using a three-step etch process: (1) 20% HF for 1.5 min to remove the oxides, stopping on the LPCVD nitride layer, (2) LPCVD nitride was dry etch using 100% $CF_4$ in a reactive ion etch (RIE) for 15 min, and (3) a 6 hr poly-Si etch using 20% KOH at 50° C. to release the cantilevers. The cantilevers were wire-bonded and packaged to do the final voltage output measurements after the different poling treatments.

After a cantilever is released and packaged, the chip carrier (with the cantilever wire-bonded to it) is mounted on a printed circuit board (PCB) to allow poling of several cantilevers simultaneously in a parallel array. The PCB is introduced into a furnace and connected to a voltage source. The poling study was carried out on the packaged devices as a function of voltage, time, and temperature. After each poling condition, the samples were tested by mounting the packaged device to a mechanical shaker. The force generated by the shaker is proportional to the acceleration, which is controlled by the applied voltage to a power amplifier (Pyle PLA2200). The amplifier was driven by a 12-V power supply, controlled using a PC frequency generator. The output voltage from the cantilever was monitored using a Tektronix digital oscilloscope (TDS 210) where the measured voltage was divided by the area of the cantilever to normalize for different cantilever shapes, calling this value voltage density (V/in²).

In an embodiment of the invention, the voltage output from the cantilevers is plotted against poling efficiency (or $\Delta V$ %). In a further embodiment of the invention, the cantilever output voltage increases with poling efficiency, with the maximum voltage output obtained using the conditions 100V/50 min/250° C. for the claimed devices.

In an embodiment of the invention, an energy harvester of the claimed invention shows a power density ranging from 1250 to 1377.6 61 µW/inch²·g. An energy harvester in accordance with an embodiment of the invention has a power density of 1377.61 µW/inch²·g. This is one of the highest reported energy densities for piezoelectric energy harvesters.

Devices of the claimed invention show that a strong correlation exists between poling efficiency and voltage output. Under optimal poling conditions of 200 kV·cm$^{-1}$ for a period of 50 min and at a temperature of 250° C., the claimed devices show a resulting output voltage density ranging from 3400 to 3600V/in².

A preferred embodiment of the invention is directed to a cantilever stack structure with multiple layers that are optimized with a specific critical attribute of cantilever structural stability, electrical and mechanical properties and material structural characteristic such as tensile strength, subsequent crystallinity, prevention of oxygen depletion and final passivation for a longer life.

While the claimed invention has certain preferred embodiments, it will be obvious to those skilled in the art that various changes and modifications may be made therein without departing from the invention, and all such changes and modifications are intended to fall within the true spirit and scope of the invention.

What is claimed is:

1. A piezoelectric energy harvester comprising stacked layers wherein the stacked layers comprise a silicon substrate layered with a polysilicon layer, a thermal silicon oxide layer, a silicon nitride layer, a PECVD silicon oxide layer, a titanium oxide layer, a PT layer and a PZT-PZN or PZT layer.

2. The energy harvester of claim 1, wherein the polysilicon layer is a sacrificial layer.

3. The energy harvester of claim 1, wherein the polysilicon layer contacts the silicon substrate.

4. The energy harvester of claim 1, wherein the thermal silicon oxide layer contacts the polysilicon layer.

5. The energy harvester of claim 1, wherein the silicon nitride layer contacts the thermal silicon oxide layer.

6. The energy harvester of claim 1, wherein the PECVD silicon oxide layer contacts the silicon nitride layer.

7. The energy harvester of claim 1, wherein the titanium oxide layer contacts the PECVD silicon oxide layer.

8. The energy harvester of claim 1, wherein the PT layer contacts the titanium oxide layer.

9. The energy harvester of claim 1, wherein the PZT-PZN or PZT layer contacts the PT layer.

10. An energy harvesting circuit comprising: a vibrational energy harvesting device in accordance with claim 1; a power rectification circuit for converting oscillatory current electric power to direct current electric power; and an energy storage device.

11. The energy harvesting circuit as recited in claim 10 wherein the energy storage device is a battery.

12. The energy harvesting circuit as recited in claim 10 wherein the energy storage device is a capacitor.

13. The energy harvester of claim 1, wherein the power density of the energy harvester ranges from 1250 to 1377.61 µW/inch2·g.

14. The energy harvester of claim 1, wherein the output voltage density ranges from 3400 to 3600 V/in$^2$.

\* \* \* \* \*